(12) United States Patent
Raley et al.

(10) Patent No.: US 10,497,575 B2
(45) Date of Patent: Dec. 3, 2019

(54) METHOD FOR INCREASING TRENCH CD IN EUV PATTERNING WITHOUT INCREASING SINGLE LINE OPENS OR ROUGHNESS

(71) Applicant: Tokyo Electron Limited, Minato-ku, Tokyo (JP)

(72) Inventors: Angelique D. Raley, Halfmoon, NY (US); Jeffrey Shearer, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/666,246

(22) Filed: Aug. 1, 2017

(65) Prior Publication Data

US 2018/0323072 A1 Nov. 8, 2018

Related U.S. Application Data

(60) Provisional application No. 62/500,637, filed on May 3, 2017.

(51) Int. Cl.
| | |
|---|---|
| *H01L 21/308* | (2006.01) |
| *H01L 21/311* | (2006.01) |
| *H01L 21/105* | (2006.01) |
| *H01L 21/3105* | (2006.01) |
| *H01L 21/027* | (2006.01) |
| *H01L 21/306* | (2006.01) |

(52) U.S. Cl.
CPC ...... *H01L 21/3088* (2013.01); *H01L 21/0274* (2013.01); *H01L 21/3081* (2013.01); *H01L 21/3086* (2013.01); *H01L 21/30604* (2013.01); *H01L 21/31051* (2013.01); *H01L 21/31116* (2013.01)

(58) Field of Classification Search
CPC .......... H01L 21/3088; H01L 21/30604; H01L 21/0274; H01L 21/31051; H01L 21/3086; H01L 21/31116; H01L 21/3081
See application file for complete search history.

(56) References Cited

U.S. PATENT DOCUMENTS

6,420,097 B1 * 7/2002 Pike .................. H01L 21/28123
257/E21.206
6,951,821 B2 10/2005 Hamelin et al.
8,435,904 B2 5/2013 Sinha et al.
(Continued)

*Primary Examiner* — Nadine G Norton
*Assistant Examiner* — Mahmoud Dahimene
(74) *Attorney, Agent, or Firm* — Wood Herron & Evans LLP (57) ABSTRACT

A substrate is provided with a patterned layer over a stack of one or more processing layers. The processing layers include at least one trim layer and at least one masking layer under the trim layer. The trim layer may have structures that have smaller linewidths than the structures of the patterned layer by utilizing an isotropic gaseous process to trim the structures of the trim layer. The structures of the trim layer, after trimming, may then be replicated in the mask layer to provide a linewidth in the mask layer that is smaller than the linewidth in the patterned layer. The technique may allow nanometer control of an EUV lithography process at pitches of 36 nm or less. In one embodiment, the technique may be utilized to provide an EUV lithography process for increasing the trench dimensions in a BEOL trench formation process step.

7 Claims, 7 Drawing Sheets

(56) References Cited

U.S. PATENT DOCUMENTS 8,735,296 B2  5/2014 Jung et al.
2005/0221513 A1* 10/2005 Yue .................. H01L 21/28123
                                                    438/14
2017/0084300 A1* 3/2017 Xiao ...................... G11B 5/855

* cited by examiner

METHOD FOR INCREASING TRENCH CD IN EUV PATTERNING WITHOUT INCREASING SINGLE LINE OPENS OR ROUGHNESS

BACKGROUND

The present disclosure relates to the processing of substrates, such as for example, semiconductor substrates. In particular, it provides a novel method to pattern substrates utilizing very narrow pitch techniques, such used in extreme ultraviolet (EUV) lithography.

As geometries in substrate processing continue to shrink, the technical challenges to forming structures on substrates via photolithography techniques increase. As requirements for 36 nm and lower pitch structures arose, a variety of photolithography techniques have been utilized for achieving suitable photolithography for such narrow pitches including EUV lithography (lithography utilizing wavelengths of light in the EUV range, most typically 13.5 nm wavelengths). However, even shifting to EUV lithography, does not solve all of the technical challenges for 36 nm and lower pitch structures. At such small linewidths it is difficult to achieve control over a wide process window. For example, for such narrower pitches, single line open defects are seen even when utilizing EUV lithography. These defects are particularly problematic for the critical dimension (CD) of trench structures formed at the back end of line (BEOL) processing steps. Other processing steps, however, are similarly affected with defects.

It would be desirable to provide a lithography integration technique that allows for tuning of CD control over a wide process window, including at CDs utilized in EUV lithography.

SUMMARY

Described herein is an innovative method to implement CD control. A substrate is provided with a patterned layer over a stack of one or more processing layers. The one or more processing layers include at least one trim layer and at least one masking layer under the trim layer. The trim layer may have structures that are formed to be smaller linewidths than the structures of the patterned layer by utilizing an isotropic gaseous process to trim the structures of the trim layer. The structures of the trim layer, after trimming, may then be replicated in the mask layer to provide a linewidth in the mask layer that is smaller than the linewidth in the patterned layer. The technique may allow nanometer level control of an EUV lithography process at pitches of 36 nm or less. In one embodiment, the technique may be utilized to provide an EUV lithography process for increasing the trench dimensions in a BEOL trench formation process step for substrate processing.

In one embodiment, a method for processing a substrate is provided. The method may comprise providing the substrate with a plurality of first patterned structures and at least one trim layer underlying the first patterned structures, the plurality of first patterned structures having at least a first pitch of 36 nm or less, the first patterned structures having a first line width and first space width. The method further comprises etching the trim layer utilizing the first patterned structures as a first mask to provide a plurality of trim layer structures. The method further comprises, after etching the trim layer, trimming the trim layer to reduce a critical dimension of the plurality of trim layer structures such that the plurality of trim layer structures have a second line width and second space width, the second line width being less than the first line width of the plurality of first patterned structures. The method further comprises utilizing the trim layer as a second mask when etching at least one layer underlying the trim layer to provide a plurality of second patterned structures in the at least one layer underlying the trim layer, a second patterned structure pitch corresponding to the first pitch.

In another embodiment, a method for processing a substrate is provided. The method comprises providing the substrate with a plurality of first patterned structures, the plurality of first patterned structures having at least a first pitch of 36 nm or less, the first patterned structures having a first line width and first space width. The method further comprises providing the substrate with a trim layer underlying the first patterned structures, providing the substrate with an intervening layer between the plurality of first patterned structures and the trim layer, and providing the substrate with a hard mask layer underlying the trim layer. The method further comprises etching the intervening layer to provide a plurality of patterned intervening layer structures corresponding to the plurality of first patterned structures and etching the trim layer to provide a plurality of patterned trim layer structures corresponding to the plurality of first patterned structures. After etching the trim layer, the method comprises trimming the trim layer with an isotropic etch process to reduce a critical dimension of the plurality of patterned trim layer structures. After trimming the trim layer, the method comprises etching the hard mask layer to provide a plurality of hard mask layer structures having a pitch corresponding to the first pitch but having a second line width that is less than the first line width of the plurality of first patterned structures.

In yet another embodiment, a method for forming a trench in a semiconductor wafer at a back end of line process step is provided. The method comprises providing a trench pattern in an EUV resist layer on the semiconductor wafer to form a plurality of EUV resist patterned structures, the plurality of EUV resist patterned structures having at least a first pitch of 36 nm or less. The method further comprises providing an intervening layer underlying the patterned EUV resist layer, the intervening layer being a planarizing layer. The method further comprises providing an oxide layer underlying the intervening layer and providing a metal hard mask layer underlying the trim layer. The method further comprises etching the oxide layer to provide a plurality of patterned oxide layer structures corresponding to the plurality of EUV resist patterned structures. After etching the oxide layer, the method comprises performing a chemical oxide removal process on the oxide layer to reduce a line width critical dimension of the plurality of oxide layer structures. After performing the chemical oxide removal process, the method comprises etching the metal hard mask layer to provide a plurality of metal hard mask layer structures having a pitch corresponding to the first pitch but having metal hard mask line width critical dimension that corresponds to the reduced line width critical dimension of the plurality of oxide layer structures. The method further comprises forming the trench in the semiconductor wafer, the trench width being larger than the spaces of the trench pattern due to performing the chemical oxide removal process.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 3:
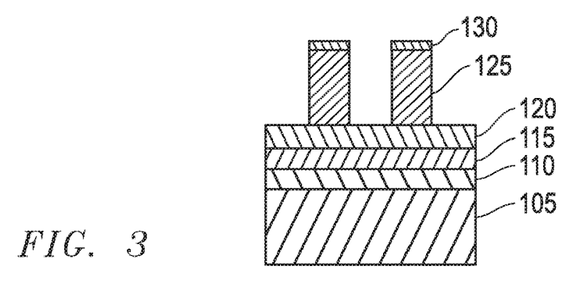
Figure 4:
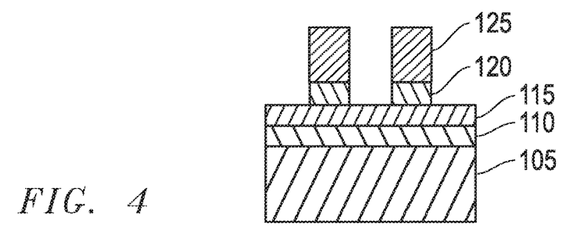
Figure 5:
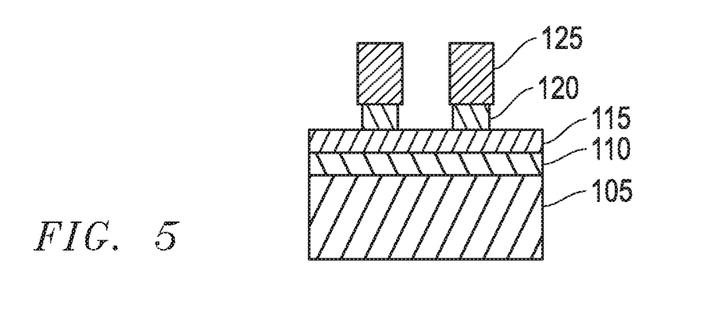
FIGS. 5-7 illustrate an exemplary embodiment for a process flow for applying an isotropic gaseous trim step to the structures provided from the process flow of FIGS. 1-4.
Figure 6:
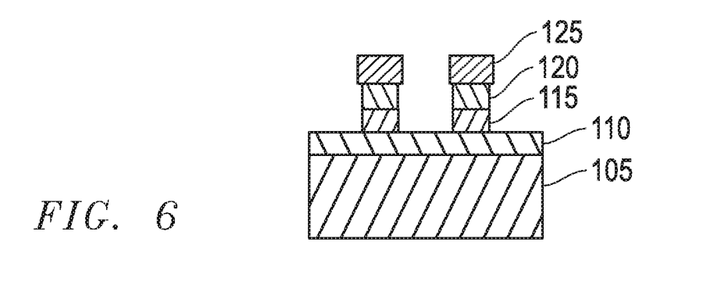
Figure 7:
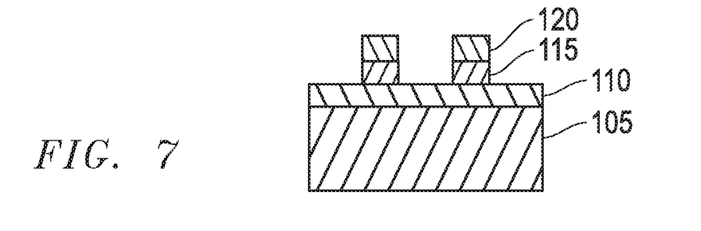
Figure 8:
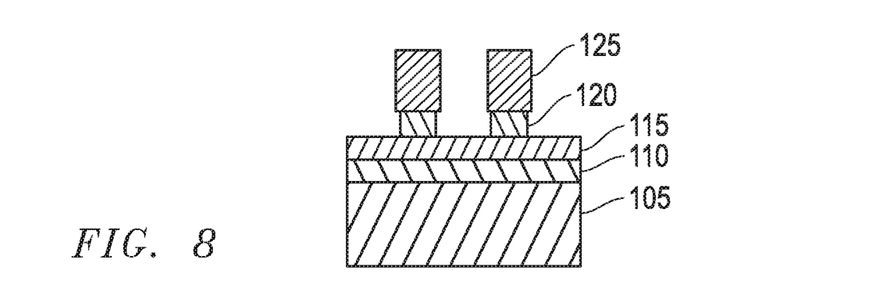
FIGS. 8-10 illustrate an alternative exemplary embodiment for a process flow for applying an isotropic gaseous trim step to the structures provided from the process flow of FIGS. 1-4.
Figure 9:
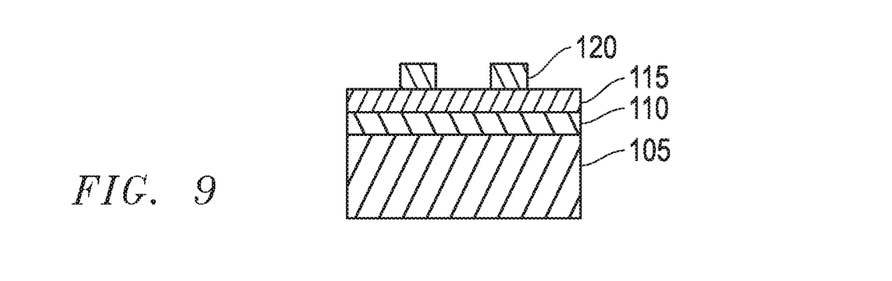
Figure 10:
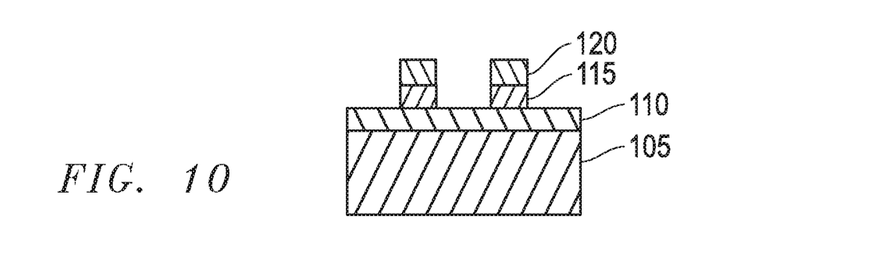
Figure 11:
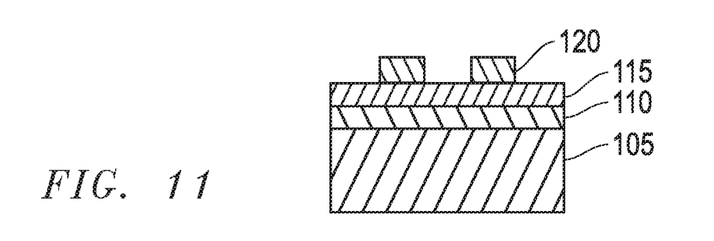
FIGS. 11-13 illustrate an alternative exemplary embodiment for a process flow for applying an isotropic gaseous trim step to the structures provided from the process flow of FIGS. 1-4.
Figure 12:
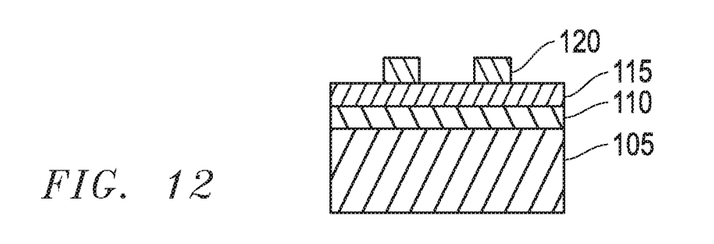
Figure 13:
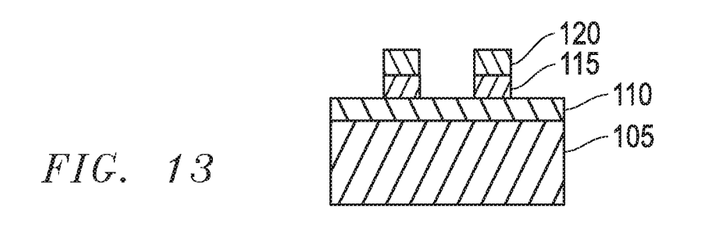

Multiple embodiments of a process integration flow utilizing an isotropic gaseous trim step are described in relation to the cross-sectional illustrations of FIGS. 1-13. As shown in FIGS. 1-4, an exemplary initial EUV lithography process flow is described. FIGS. 5-7 illustrate one exemplary subsequent series of process steps for processing the structures provided at FIG. 4. FIGS. 8-10 illustrate another exemplary subsequent series of process steps for processing the structures provided at FIG. 4. FIGS. 11-13 illustrate another exemplary subsequent series of process steps for processing the structures provided at FIG. 4.

Figure 1:
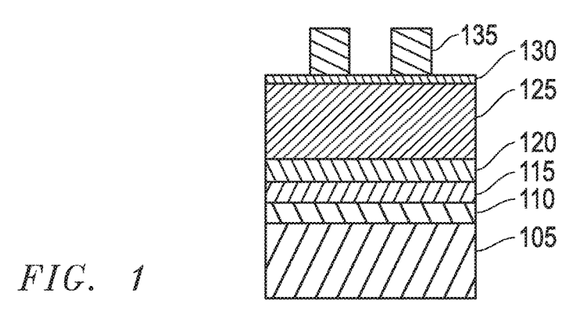
FIGS. 1-4 illustrate exemplary process steps for one embodiment of an exemplary lithography process flow.

As shown in FIG. 1, a patterned EUV resist layer 135 may be formed which has a plurality of patterned structures. The patterning of the EUV resist layer 135 may be accomplished via conventional EUV techniques known in the art. The patterned structures of the patterned EUV resist layer 135 may be formed utilizing EUV lithography techniques. A plurality of other lithography layers may be provided between the patterned EUV resist layer 135 and a substrate 105. It will be recognized that though the concepts described herein are provided with regard to EUV lithography techniques, the concepts described herein may be also applicable to other lithography techniques, including those with pitches narrower than those achievable with EUV lithography techniques. Thus, the use of the concepts described herein for the formation of structures having pitches of 36 nm or less through EUV lithography techniques will be recognized to be merely exemplary.

Substrate 105 may be any substrate for which the use of patterned features is desirable. For example, in one embodiment, substrate 105 may be a semiconductor substrate having one or more semiconductor processing layers formed thereon. In one embodiment, the substrate 105 may be a substrate that has been subject to multiple semiconductor processing steps which yield a wide variety of structures and layers, all of which are known in the substrate processing art and may be considered to be part of the substrate 105. In one embodiment, the concepts disclosed herein may be utilized at a (BEOL) processing step. In such an embodiment, it may be desirable to form trenches in the substrate. As known in the art, such trenches may be formed in regions that will correspond to the regions between adjacent patterned structures of EUV resist layer 135. The techniques described herein may be utilized to provide masking layer linewidths which are narrower than those of the patterned structures of EUV resist layer 135, such that trenches may be formed in the substrate which have increased CDs as compared to the CDs of the space between adjacent patterned structures provided at the step of forming the patterned structures of the EUV resist layer 135.

As mentioned, one or more intervening lithography layers may be provided between the patterned EUV resist layer 135 and a substrate 105. Thus, as shown in one exemplary embodiment of FIG. 1, an antireflective coating (ARC) layer 130, an intervening masking layer 125, a trim layer 120, a hard mask layer 115, and an etch stop layer 110 may be provided. It will be recognized that the particular stack of intervening lithography layers may vary while still obtaining the benefits of the concepts described herein. Thus, for example, more or less layers may be utilized. For example, an antireflective layer need not be utilized or multiple antireflective layers may be utilized (such as, for example, the use of both an ARC layer and a bottom antireflective coating (BARC) layer). Further, the particular composition of each layer may vary and the layers may be deposited in a variety of manners, as would be recognized in the art. In one embodiment, for example, the intervening masking layer 125 may be a relatively thick layer which provides planarization benefits by planarizing step heights across the substrate. In this case, an intervening planarization layer is provided. In one embodiment, the planarization layer may be an organic planarization layer and, in another embodiment, it may be a spin on hard mask layer. It will be recognized, however, that other materials and thicknesses may be utilized for the intervening masking layer. Further, the trim layer 120 may be an oxide layer in one embodiment. In one more particular embodiment the trim layer 120 may be an oxide layer formed through a tetraethyl orthosilicate (TEOS) deposition process, thus providing a TEOS deposited oxide. Still in other embodiments, the trim layer may be different oxide layer, a silicon nitride layer, a silicon layer, etc. or combinations thereof, all as would be recognized after having the benefit of the disclosures provided herein. A variety of other deposition processes may be utilized for depositing the trim layer 120. For example, the deposition process may be an atomic layer deposition process. In one embodiment, the trim layer 120 is a TEOS oxide in thickness range of 10 nm to 60 nm and more preferably 15 nm to 25 nm. In one embodiment, the hard mask layer 115 may be a metal hard mask layer. In a more particular embodiment, the hard mask layer 115 may be a titanium nitride layer. As will be recognized, the etch stop layer may be comprised of a wide range of materials. In one embodiment, the etch stop layer is chosen of a material which would provide suitable etch selectivity between the etch stop layer 110 and the hard mask layer 115 (or etch selectivity to one of the other intervening lithography layers formed on the substrate 105). In one embodiment, the etch stop layer 110 may be comprised of $SiO_2$ or $Si_3N_4$, though other materials may be utilized as it will be recognized that the etch stop layer may merely be a layer which provides a desired level of etch selectivity between the overlying layer(s) being etched and the etch stop layer. Further, in other embodiments, a separate etch stop layer may not even be utilized.

Figure 2:
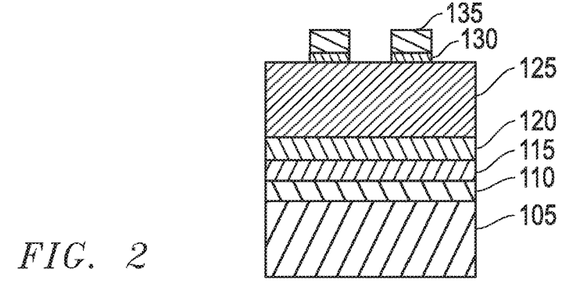

Processing of the structures shown in FIG. 1 may proceed to the state shown in FIG. 2 by opening the ARC layer 130 as shown. Next the intervening masking layer 125 may be opened as shown in FIG. 3. Thus, at this stage some portions of the intervening masking layer 125 remain overlying the trim layer 120 while other portions have been removed. Processing may then proceed to FIG. 4 in which the trim layer 120 is opened as shown in FIG. 4. The particular etch utilized to open the trim layer 120 will depend upon the material utilized to form the trim layer. However, the etch utilized in the process stage of FIG. 4 will generally be a relatively anisotropic etch process.

After the processing shown in FIG. 4, the structures formed will be subjected to an isotropic etch in which the size of the structure formed in the trim layer may trimmed a desired amount so that the patterned formed in the trim layer 120 is modified in a repeatable and well defined manner to be narrower than the initial pattern that was formed in the EUV resist layer 135. In one embodiment, the isotropic etch may be an isotropic gaseous chemical removal process. The process flow utilized to implement the trim techniques may vary. For example, the trim techniques may be accomplished after the processing of FIG. 4 by next performing the steps shown in FIGS. 5-7. Alternatively, the trim techniques may be accomplished after the processing FIG. 4 by next performing the steps shown in FIGS. 8-11. In still another embodiment, the trim techniques may be accomplished after the processing of FIG. 4 by next performing the steps shown in FIGS. 11-13. As will be recognized by those in the art, other process flow embodiments may also benefit from the trim techniques described as the embodiments shown are only meant to be exemplary embodiments.

In one embodiment, after the processing shown in FIG. 4, the trim layer 120 is subjected to an isotropic etch which will trim the linewidth of the structures formed in the trim layer. In the embodiment of FIGS. 5-7, the trim process is performed as shown in FIG. 5. In the embodiment of FIGS. 8-10, the trim process is performed as shown in FIG. 8. In the embodiment of FIGS. 11-13, the trim process is performed as shown in FIG. 12. The reduction of the linewidths is performed in a highly controllable manner to provide fine adjustment to the critical dimensions formed. In one example, the linewidth of the structures formed in the trim layer 120 may be reduced by 0.2 nm increments up to 5 nm total, and more preferably 0.2-2 nm total CD adjustment. In other embodiments, the reduction may be 0.2-2 nm. The techniques provided herein advantageously allow accurate control of such fine reductions in linewidth in a well-controlled pattern that does not display single line opens.

In the embodiment of FIGS. 5-7, after the trimming of trim layer 120 is performed in FIG. 5, the hard mask layer 115 may be etched to open the hard mask layer 115 as shown in FIG. 6. As shown in FIG. 7, the intervening masking layer 125 may then be removed in a manner that does not significantly impact the patterning of the trim layer 120 and the hard mask layer 115. For example, if the intervening masking layer 125 is an organic planarization layer then a plasma ash process may be utilized to remove the intervening masking layer 125. At the point of processing shown in FIG. 7, a structure is provided which can be utilized as a masking structure to form the desired pattern in the etch stop layer and/or any particular layers of the substrate 105. For example, if the techniques described in FIGS. 1-7 are implemented in a substrate such as a semiconductor wafer at the BEOL processing steps, the masking structure provided at the step of FIG. 7 may be utilized to form trenches in one or more layers of the substrate 105. The trenches formed will replicate the critical dimensions as shown in FIG. 7 which have been trimmed from the critical dimensions shown in the EUV resist layer 135, FIGS. 1 and 2. In this manner, the trenches may be controllably well-defined to have a wider trench than would be normally allowed under the tolerances of the EUV patterning of the EUV resist layer 135.

In the embodiment of FIGS. 8-10, the trimming of trim layer 120 is performed in FIG. 8, similar to as explained above with reference to FIG. 5. For the embodiment of FIGS. 8-10, the removal of the intervening masking layer 125 is performed at FIG. 9, such as for example in one embodiment, through a plasma ash process as described above. Then, the hard mask layer 115 may be etched to open the hard mask layer 115 as shown in FIG. 10. At this step, a masking structure is thus formed that may be utilized for subsequent processing as described above with relation to FIG. 7.

In the embodiment of FIGS. 11-13, the trimming techniques are accomplished after removal of the intervening masking layer 125. Thus, techniques such as described above to remove the intervening masking layer are performed as shown in FIG. 11. Then the trimming of trim layer 120 is performed in FIG. 12, similar to as explained above with reference to FIG. 5. However, in this embodiment, the isotropic etch will trim the trim layer not only along the exposed sidewalls but also along the exposed top surfaces. Then, the hard mask layer 115 may be etched to open the hard mask layer 115 as shown in FIG. 13. At this step, a masking structure is thus formed that may be utilized for subsequent processing as described above with relation to FIG. 7.

Various isotropic etches may be utilized to perform the trimming of the trim layer 120. In one embodiment a gaseous chemical etch may be utilized. Such an etch may be implemented in a manner to provide nanometer level control of the trimming process such that it is suitable for trimming EUV patterned structures to the level of control described herein. In one embodiment, for an oxide layer that is utilized for the trim layer 120, a gaseous chemical oxide removal process may be utilized. One exemplary gaseous chemical oxide removal process is an ammonia (NH3) and hydrogen fluoride (HF) process. In such a process, the layer to be trimmed is exposed to a gaseous combination of NH3 and HF after which thermal treatment is applied to heat the layer being removed to aid in the chemical removal of the layer. In addition, inert gaseous such as nitrogen and argon may be added to the gaseous treatment. The chemical exposure and thermal heating provide a controllable reaction for removing the small amounts of the oxide in the nanometer levels desired. Such gaseous chemical oxide removal etches are known to those in the art, such as available through use of the CERTAS® system from Tokyo Electron Limited. Other gaseous combinations may be utilized and the chemistry utilized will vary depending upon the makeup of the layer to be trimmed. For example, a silicon trim layer may be subject to a gaseous mixture which includes NH3 and a fluorine containing gas. It will be recognized that many other gaseous removal process may be utilized as a gaseous removal process. Further, it will recognized after having the benefit of this disclosure that other isotropic etch processes may be utilized to achieve the nanometer level trim techniques disclosed herein.

In one embodiment, the techniques described herein may be utilized for EUV patterned structures having pitches of 36 nm or less. In one embodiment, the pitch of the patterned structures in the EUV resist layer 135 may be 36 nm, formed from 20 nm lines and 16 nm spaces. The trim techniques described herein may be utilized to controllably reduce the 20 nm lines. In one embodiment, the linewidths may be trimmed in ranges of about 0.2 to 5 nm and more preferably 0.5 to 2 nm, with accuracy to a sub-nanometer level. For example, trimming can be utilized to accurately provide lines of 14.6 nm, 15.1 nm or 15.9 nm from the original 20 nm patterned lines (and accordingly correspondingly wider spaces). In this manner linewidths narrower than what may be accurately formed with the EUV process may be achieved. It will be recognized that the techniques may be utilized with lithography processes that have less than a 36 nm pitch. Thus, an EUV process which provides a 30 nm pitch (15 nm lines and 15 nm spaces), may similarly utilized the techniques described to reduce the 15 nm lines, for example to 14.5 or 14 nm lines. In this manner, nanometer level reduction in the linewidth of very narrower lithography processes may be achieved to extend the process margin beyond that repeatedly and accurately achievable though just lithographic exposure. In this manner, the techniques described herein are not limited to just EUV lithography, but rather can be applied to other masking processes in which a nanometer level reduction of linewidth is desired. Further, the techniques described herein allow for such linewidth reductions without causing single line open defects.

It will be recognized that the substrate 105 may be comprised of one or many layers. For example, the substrate 105 may be a semiconductor wafer that has many process layers formed on or in the semiconductor wafer. Thus, for example, the substrate 105 may be a semiconductor wafer at any process step in a semiconductor processing flow. For example, the substrate 105 may comprise a semiconductor wafer and all of its accompanying layers formed up to any particular process step. Further, it will be recognized that the various process layers and structures shown may be utilized with additional intervening process layers and coatings as would be understood by those in the art. Thus, for example, more or less materials may be utilized between the EUV resist layer 135 and the substrate 105, Thus, it will be recognized that the use of a pattern trimming process in which an intervening layer between the EUV resist layer 135 and the substrate 105 is trimmed may be accomplished within a wide variety of process flows, all of which may advantageously benefit from the characteristics an organic spacer provides. Further, it will be recognized that many of the layers shown in the figures may be considered to be part of the substrate.

Figure 14:
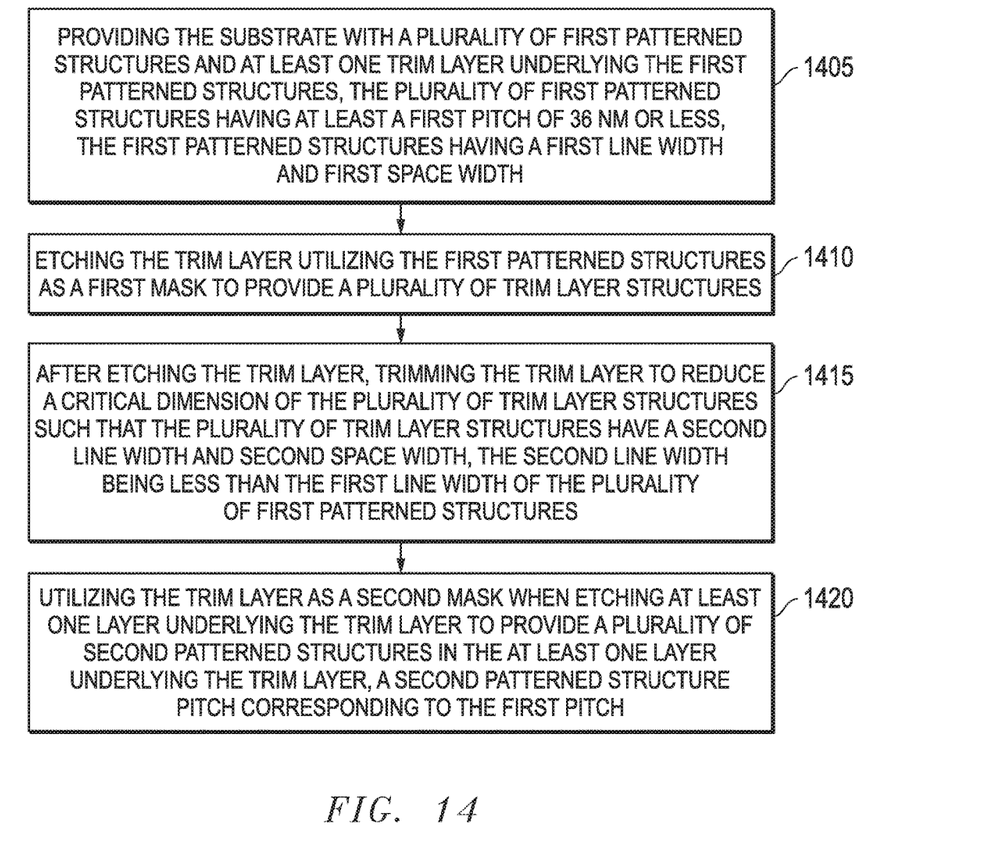
FIGS. 14-16 illustrate exemplary process flow charts for various embodiments of the substrate processing techniques disclosed herein.
Figure 15:
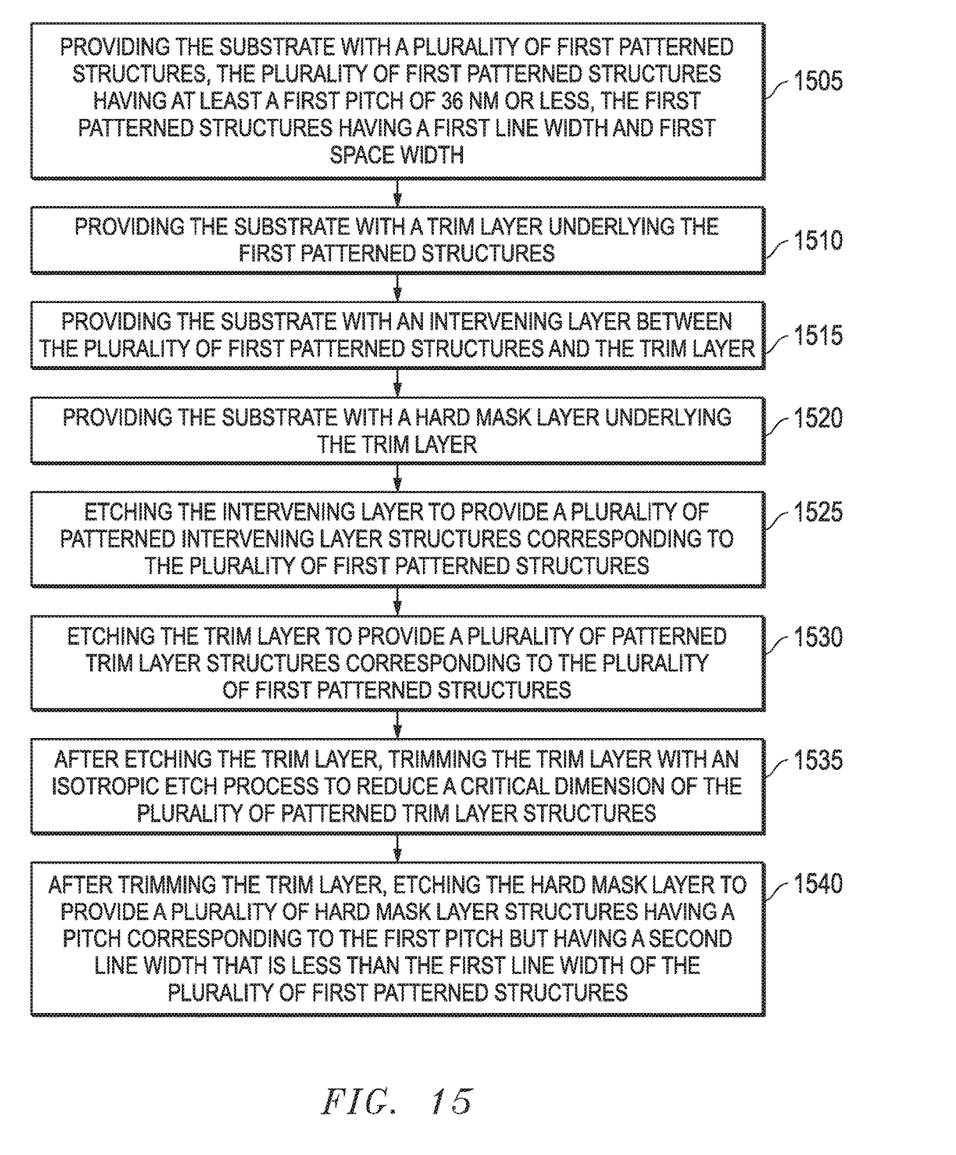
Figure 16:
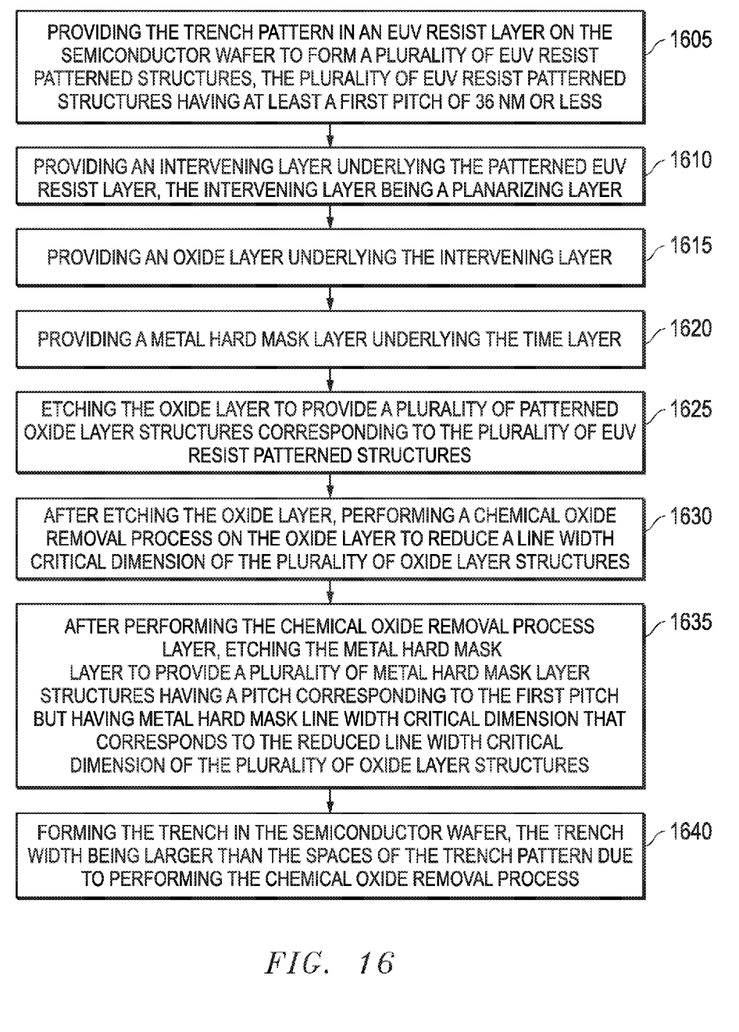

Exemplary process flows for utilizing the techniques described herein are provided in FIGS. 14-16. It will be recognized that these process flows are merely exemplary and the techniques described herein may be utilized in other manners. Further, it will be recognized that additional steps may be added to the exemplary process flows while still utilizing the advantageous benefits of the techniques disclosed herein. Additionally, it will be recognized by those skilled in the art that various steps of the process flows may be performed together or in combination, and thus, each step of the process flows is not limited to being a separate independent process step.

FIG. 14 illustrates a method for processing a substrate. The method may include a step 1405 of providing the substrate with a plurality of first patterned structures and at least one trim layer underlying the first patterned structures, the plurality of first patterned structures having at least a first pitch of 36 nm or less, the first patterned structures having a first line width and first space width. Next, at step 1410 the method includes etching the trim layer utilizing the first patterned structures as a first mask to provide a plurality of trim layer structures. After etching the trim layer, step 1415 is performed by trimming the trim layer to reduce a critical dimension of the plurality of trim layer structures such that the plurality of trim layer structures have a second line width and second space width, the second line width being less than the first line width of the plurality of first patterned structures. Finally, at step 1420, the trim layer is utilized as a second mask when etching at least one layer underlying the trim layer to provide a plurality of second patterned structures in the at least one layer underlying the trim layer, a second patterned structure pitch corresponding to the first pitch.

FIG. 15 illustrates another method for processing a substrate. The method may include a step 1505 of providing the substrate with a plurality of first patterned structures, the plurality of first patterned structures having at least a first pitch of 36 nm or less, the first patterned structures having a first line width and first space width. The method also includes, at step 1510, providing the substrate with a trim layer underlying the first patterned structures. The method includes, at step 1515, providing the substrate with an intervening layer between the plurality of first patterned structures and the trim layer. The method includes, at step 1520, providing the substrate with a hard mask layer underlying the trim layer. At step 1525 the intervening layer is etched to provide a plurality of patterned intervening layer structures corresponding to the plurality of first patterned structures. Next, at step 1530, processing includes etching the trim layer to provide a plurality of patterned trim layer structures corresponding to the plurality of first patterned structures. After etching the trim layer, the trim layer is trimmed, at step 1535, with an isotropic etch process to reduce a critical dimension of the plurality of patterned trim layer structures. Finally, after trimming the trim layer, the processing continues at step 1540 by etching the hard mask layer to provide a plurality of hard mask layer structures having a pitch corresponding to the first pitch but having a second line width that is less than the first line width of the plurality of first patterned structures.

FIG. 16 illustrates a method for forming a trench in a semiconductor wafer at a back end of line process step. The method may include a step 1605 of providing a trench pattern in an EUV resist layer on the semiconductor wafer to form a plurality of EUV resist patterned structures, the plurality of EUV resist patterned structures having at least a first pitch of 36 nm or less. The method may further include step 1610 of providing an intervening layer underlying the patterned EUV resist layer, the intervening layer being a planarizing layer. The method also includes step 1615 of providing an oxide layer underlying the intervening layer and step 1620 of providing a metal hard mask layer underlying the trim layer. Then, at step 1625, the method includes etching the oxide layer to provide a plurality of patterned oxide layer structures corresponding to the plurality of EUV resist patterned structures. Then at step 1630, after etching the oxide layer, the method includes performing a chemical oxide removal process on the oxide layer to reduce a line width critical dimension of the plurality of oxide layer structures. Then at step 1635, performing the chemical oxide removal process, the method includes etching the metal hard mask layer to provide a plurality of metal hard mask layer structures having a pitch corresponding to the first pitch but having metal hard mask line width critical dimension that corresponds to the reduced line width critical dimension of the plurality of oxide layer structures. Finally, at step 1640, the method includes forming the trench in the semiconductor wafer, the trench width being larger than the spaces of the trench pattern due to performing the chemical oxide removal process.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method for forming a trench in a semiconductor wafer at a back end of line process step, comprising:
   providing a trench pattern in an EUV resist layer on the semiconductor wafer to form a plurality of EUV resist patterned structures, the plurality of EUV resist patterned structures having at least a first pitch of 36 nm or less;
   providing an intervening layer on the semiconductor wafer and underlying the EUV resist layer, the intervening layer being a planarizing layer;
   providing an oxide layer on the semiconductor wafer and underlying the intervening layer;
   providing a metal hard mask layer on the semiconductor wafer and underlying the oxide layer;
   etching the intervening layer and the oxide layer with an anisotropic etch process to provide a plurality of patterned oxide layer structures corresponding to the plurality of EUV resist patterned structures and with portions of the intervening layer remaining overlying the patterned oxide layer structures;
   after etching the oxide layer, performing an isotropic chemical oxide removal process on the oxide layer to reduce a line width critical dimension of the plurality of patterned oxide layer structures in incremental reductions to a total reduction of up to 5 nm, wherein the isotropic chemical oxide removal process includes:
      first, exposing the plurality of patterned oxide layer structures to a gaseous chemical to form a reaction layer on sidewalls of the plurality of patterned oxide layer structures,
      second, thermally treating the plurality of patterned oxide layer structures to remove the reaction layer to achieve the incremental reduction, and
      repeating the exposing and thermally treating until the total reduction is obtained;
   after performing the chemical oxide removal process, etching the metal hard mask layer to provide a plurality of metal hard mask layer structures having a pitch corresponding to the first pitch but having a metal hard mask line width critical dimension that corresponds to the reduced line width critical dimension of the plurality of patterned oxide layer structures; and
   using the plurality of metal hard mask layer structures as a mask, forming the trench in the semiconductor wafer that is underlying the metal hard mask layer structures, a trench width being larger than a space of the trench pattern due to performing the chemical oxide removal process.

2. The method of claim 1, wherein the intervening layer is an organic planarization layer or a spin on hard mask layer.

3. The method of claim 2, wherein the portions of the intervening layer remain overlying the oxide layer during the chemical oxide removal process.

4. The method of claim 3, wherein the portions of the intervening layer are removed after etching the metal hard mask.

5. The method of claim 3, wherein the portions of the intervening layer are removed prior to etching the metal hard mask.

6. The method of claim 2, wherein the portions of the intervening layer are removed prior to the chemical oxide removal process.

7. The method of claim 3, wherein the incremental reduction is 0.2 nm.

* * * * *

UNITED STATES PATENT AND TRADEMARK OFFICE
CERTIFICATE OF CORRECTION

PATENT NO. : 10,497,575 B2
APPLICATION NO. : 15/666246
DATED : December 3, 2019
INVENTOR(S) : Raley et al.

Page 1 of 1

It is certified that error appears in the above-identified patent and that said Letters Patent is hereby corrected as shown below:

On the Title Page

Item (73), "Assignee: Tokyo Electron Limited, Tokyo (JP)" should read --Assignees: Tokyo Electron Limited, Tokyo (JP); International Business Machines Corporation, Armonk, NY (US)--

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*